(12) United States Patent
Akutsu (10) Patent No.: US 7,057,193 B2
(45) Date of Patent: Jun. 6, 2006

(54) EXPOSURE APPARATUS

(75) Inventor: Kotaro Akutsu, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 20 days.

(21) Appl. No.: 10/649,645

(22) Filed: Aug. 28, 2003

(65) Prior Publication Data

US 2004/0041101 A1 Mar. 4, 2004

(30) Foreign Application Priority Data

Aug. 30, 2002 (JP) ............................. 2002-255110

(51) Int. Cl.
*G21K 5/10* (2006.01)

(52) U.S. Cl. ............... 250/492.22; 356/401; 250/398; 250/396 R; 250/397

(58) Field of Classification Search .......... 250/492.1, 250/492.22, 491.1, 398, 396 R, 397; 430/296, 430/30, 5; 355/53; 356/401
See application file for complete search history.

(56) References Cited

U.S. PATENT DOCUMENTS

| | | | | |
|---|---|---|---|---|
| 5,552,888 | A | * | 9/1996 | Sogard et al. ............... 356/500 |
| 5,717,482 | A | * | 2/1998 | Akutsu et al. ................ 355/53 |
| 5,858,587 | A | | 1/1999 | Yamane et al. ............... 430/22 |
| 5,864,142 | A | | 1/1999 | Muraki et al. ............. 250/491.1 |
| 5,923,454 | A | * | 7/1999 | Eastmond et al. .......... 398/202 |
| 6,054,713 | A | | 4/2000 | Miyake et al. ......... 250/492.24 |
| 6,341,007 | B1 | * | 1/2002 | Nishi et al. .................... 355/53 |
| 6,392,243 | B1 | * | 5/2002 | Muraki ..................... 250/491.1 |
| 6,400,441 | B1 | * | 6/2002 | Nishi et al. .................... 355/53 |
| 6,417,914 | B1 | * | 7/2002 | Li ................................ 355/75 |
| 6,583,597 | B1 | | 6/2003 | Tanaka et al. ............... 318/687 |
| 2001/0006762 | A1 | * | 7/2001 | Kwan et al. ................. 430/311 |
| 2001/0055117 | A1 | * | 12/2001 | Mizutani ..................... 356/401 |
| 2002/0063856 | A1 | * | 5/2002 | Inoue .......................... 355/53 |
| 2002/0070699 | A1 | | 6/2002 | Tanaka et al. .............. 318/687 |
| 2002/0132409 | A1 | * | 9/2002 | Akutsu et al. .............. 438/200 |

FOREIGN PATENT DOCUMENTS

| | | |
|---|---|---|
| JP | 55-009418 | 1/1980 |
| JP | 61-023317 | 1/1986 |
| JP | 5-89815 | 4/1993 |
| JP | 05-226232 | 9/1993 |
| JP | 05-343306 | 12/1993 |
| JP | 08-203810 | 8/1996 |
| JP | 09-159800 | 6/1997 |
| JP | 09-246134 | 9/1997 |
| JP | 9-330867 | 12/1997 |
| JP | 11-016815 | 1/1999 |
| JP | 2002-119038 | 4/2002 |

OTHER PUBLICATIONS

Japanese Office Action dated Jun. 6, 2005, issued in corresponding Japanese patent application number 2002-255110.

* cited by examiner

*Primary Examiner*—Nikita Wells
*Assistant Examiner*—Johnnie L Smith, II
(74) *Attorney, Agent, or Firm*—Fitzpatrick, Cella, Harper & Scinto

(57) ABSTRACT

An exposure apparatus which draws a pattern on a substrate with electron beams. The apparatus includes a substrate stage which supports the substrate, a transfer stage which moves the substrate stage, an electromagnetic actuator which moves the substrate stage relative to the transfer stage, a first measurement system which measures a position of the transfer stage, a second measurement system which measures a position of the substrate stage, a controller which controls the electromagnetic actuator on the basis of measurement results obtained by the first and second measurement systems, a deflector which deflects electron beams with which the substrate is irradiated, and a filter which performs filtering for a measurement result obtained by the second measurement system and supplies the filtered measurement result to the deflector.

11 Claims, 9 Drawing Sheets

EXPOSURE APPARATUS

FIELD OF THE INVENTION

The present invention relates to an exposure apparatus which draws a pattern on a substrate using electron beams and a device manufacturing method using the same.

BACKGROUND OF THE INVENTION

A lithography technique for reducing and transferring various patterns formed on a mask onto a wafer with light beams is used to manufacture devices such as a semiconductor device and the like. A mask pattern for use in lithography is required to have an extremely high degree of accuracy. Hence, to form a mask pattern, an electron beam exposure apparatus is employed. An electron beam exposure apparatus is also employed to directly draw a pattern on a wafer without any masks.

Electron beam exposure apparatuses include, e.g., a point-beam type apparatus which uses spot-like beams and a variable rectangular beam type apparatus which uses beams each having a variable-size rectangular cross section. A general electron beam exposure apparatus of either type comprises an electron gun which generates electron beams, an electron optical system for guiding electron beams emitted from the electron gun onto a sample, a stage system for performing scan driving for the sample to draw a pattern on the entire sample with electron beams, and an objective deflector for positioning electron beams on the sample at high accuracy.

A region in which the objective deflector can position electron beams is designed to have a width of about several mm in order to minimize any aberration in the electron optical system. When a silicon wafer is employed as the sample, its diameter is about 200 to 300 mmϕ. On the other hand, when a glass substrate to be used as a mask is employed, its size is about 150 mm square. For this reason, the electron beam exposure apparatus has a stage which can perform scan driving for the sample to draw a pattern on the entire sample with electron beams.

The stage is arranged in a vacuum chamber. The stage is required not to cause any variation in magnetic field, which may affect the positioning of electron beams. For this reason, a contact actuator such as a ball screw actuator is used in a conventional stage.

Conventionally, an increase in speed has been demanded for lithography. For example, Japanese Patent Laid-Open No. 9-330867 discloses a multi electron beam exposure apparatus which irradiates the surface of a sample with a plurality of electron beams in accordance with design coordinates and scans the sample surface while deflecting the plurality of electron beams in accordance with the design coordinates and individually turning on/off the plurality of electron beams in accordance with a pattern to be drawn. A multi electron beam exposure apparatus can draw a pattern with a plurality of electron beams and thus can increase the throughput.

Figure 6:
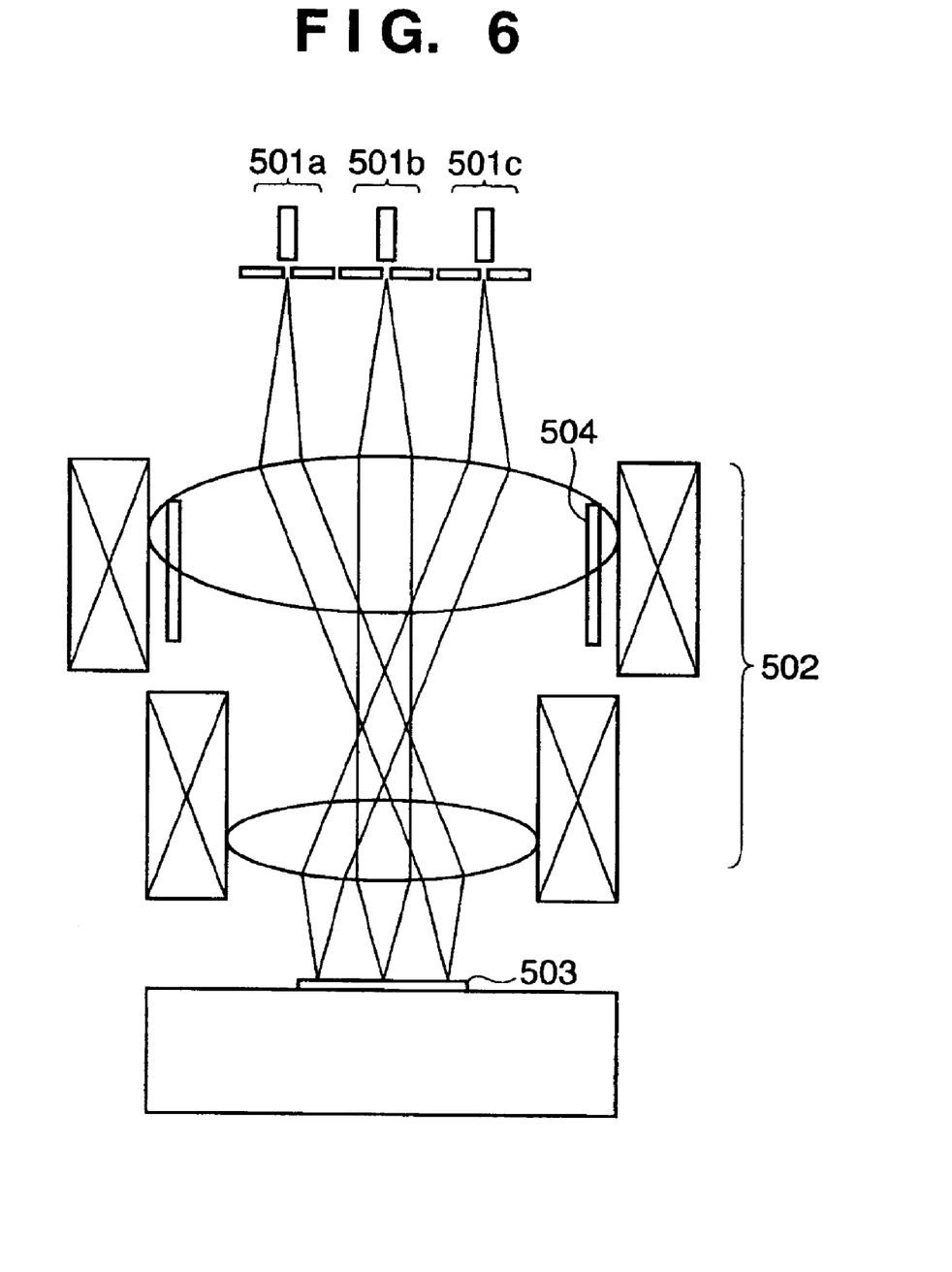
FIG. 6 is a view showing the outline of a conventional multi electron beam exposure apparatus.

FIG. 6 is a view showing the outline of a multi electron beam exposure apparatus. Electron guns 501a, 501b, and 501c can individually turn on/off electron beams. A reduction electron optical system 502 reduces and projects a plurality of electron beams from the electron guns 501a, 501b, and 501c onto a wafer 503. A deflector 504 scans the plurality of electron beams to be reduced and projected onto the wafer 503.

Figure 7:
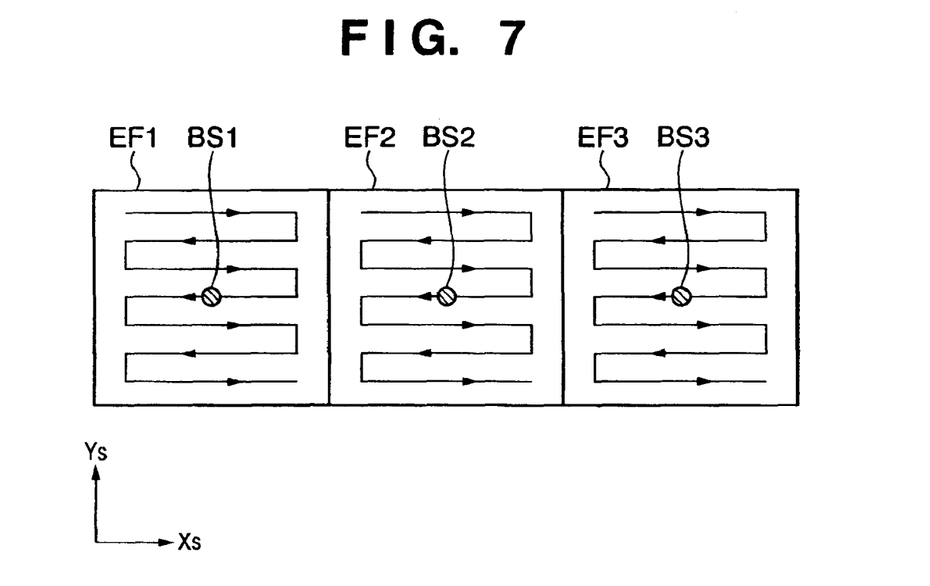
FIG. 7 is a view showing how a wafer is scanned with a plurality of electron beams.

FIG. 7 shows how the multi electron beam exposure apparatus in FIG. 6 scans a wafer with a plurality of electron beams. White circles represent beam reference positions (BS1, BS2, and BS3) at which each electron beam comes incident on the wafer when it is not deflected by the deflector 504. The beam reference positions are plotted along a design orthogonal coordinate system (Xs,Ys). The respective electron beams scan exposure fields (EF1, EF2, and EF3) for the respective electron beams in accordance with the design orthogonal coordinate system (Xs,Ys) with reference to the beam reference positions. The exposure fields are arranged adjacent to each other, so that a larger pattern can be drawn.

The positioning responsiveness of electron beams is extremely high. For this reason, instead of an arrangement for improving the mechanical control characteristics of a stage, there is generally employed an arrangement for adjusting the incident positions of electron beams with respect to a wafer by measuring the posture and positional shift amount of the stage and controlling a deflector for scanning the electron beams on the basis of the measurement result, as disclosed in, e.g., Japanese Patent Laid-Open No. 5-89815. This method, however, is based on the premise that the positional relationship between a wafer to be exposed and a measuring mirror used to measure the posture and positional shift amount of the stage remains unchanged. For example, if a structure is distorted by an external force to cause fluctuations in relative position between the measuring mirror and wafer, a pattern error may occur.

In a conventional single-beam exposure apparatus, a focus error (fluctuations in posture) in a stage causes no serious problem. On the other hand, in a multi electron beam exposure apparatus which uses a plurality of electron beams, Z-direction adjustment and posture adjustment (a tilt mechanism) are required to position each electron beam within a predetermined focus tolerance. An increase in the number of degrees of freedom in adjustment increases the number of actuators. The use of an actuator having high rigidity such as a contact actuator is highly disadvantageous in that a structure is distorted by a driving reaction force.

An electromagnetic actuator can implement a non-contact arrangement having no rigidity and can solve problems of a driving reaction force and dust. In electron beam exposure, any fluctuations in magnetic field are not allowed even if they are small. Fluctuations in magnetic field can be reduced by arranging an electromagnetic actuator at a position remote from a substrate-bearing surface and providing a multiple shield in the electromagnetic actuator. Therefore, the use of an electromagnetic actuator presently attracts attention.

If an electromagnetic actuator is to be employed as an actuator for stage driving in an electron beam exposure apparatus, the electromagnetic actuator must be arranged at a position remote from a substrate-bearing surface, as described above. For this reason, if position measurement for stage control is performed using a mirror arranged on the substrate-bearing surface, vibrations having various natural frequencies occur in a control system. The control gain cannot be set to a high value, thus resulting in difficulty in high-speed and stable control of a stage. Conventionally, this makes it difficult to draw a pattern on a substrate at high speed and high accuracy.

SUMMARY OF THE INVENTION

The present invention has been made in consideration of the above-mentioned background, and has as its object to, e.g., draw a pattern on a substrate at high speed and high accuracy or stably control a substrate stage in addition to this.

According to the present invention, there is provided an exposure apparatus which draws a pattern on a substrate with electron beams, comprising a substrate stage which supports the substrate, a transfer stage which moves with the substrate stage on board, an electromagnetic actuator which moves the substrate stage relative to the transfer stage, a first measurement system which measures a position of the transfer stage, a second measurement system which measures a position of the substrate stage, a controller which controls the electromagnetic actuator on the basis of measurement results obtained by the first and second measurement systems, a deflector which deflects electron beams with which the substrate is irradiated, and a filter which performs filtering for a measurement result obtained by the second measurement system and supplies the filtered measurement result to the deflector.

According to a preferred embodiment of the present invention, preferably, the second measurement system measures rotation of the substrate stage in addition to the position of the substrate stage, and the deflector adjusts deviations of electron beams on the basis of the position and rotation of the substrate stage obtained by the second measurement system.

According to a preferred embodiment of the present invention, preferably, the second measurement system includes a first sensor which measures a position of the substrate stage with reference to a predetermined reference position, and a second sensor which measures a position of the substrate stage relative to the transfer stage, the controller controls the electromagnetic actuator on the basis of measurement results obtained by the first measurement system and the second sensor, and the filter performs filtering for a measurement result obtained by the first sensor to supply the filtered measurement result to the deflector.

According to a preferred embodiment of the present invention, the second sensor is preferably arranged to measure a relative position of the substrate stage in the vicinity of the electromagnetic actuator.

According to a preferred embodiment of the present invention, preferably, the substrate stage has a substrate holder on the substrate stage, and the electromagnetic actuator and the substrate are arranged on opposite sides of a barycenter of the transfer stage in a Z-axis direction.

According to a preferred embodiment of the present invention, the filter preferably includes a band-limiting filter (e.g., a low-pass filter) which blocks a predetermined band.

According to a preferred embodiment of the present invention, the electromagnetic actuator preferably includes an electromagnet as a driving source. Alternatively, the electromagnetic actuator preferably includes a linear motor.

According to a preferred embodiment of the present invention, the electromagnetic actuator is preferably coated with an electromagnetic shield.

According to the present invention, there is provided a device manufacturing method comprising a step of drawing a pattern on a substrate coated with a photosensitive agent using the above-mentioned exposure apparatus, and a step of developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described with reference to the accompanying drawings.
[First Embodiment]

Figure 1:
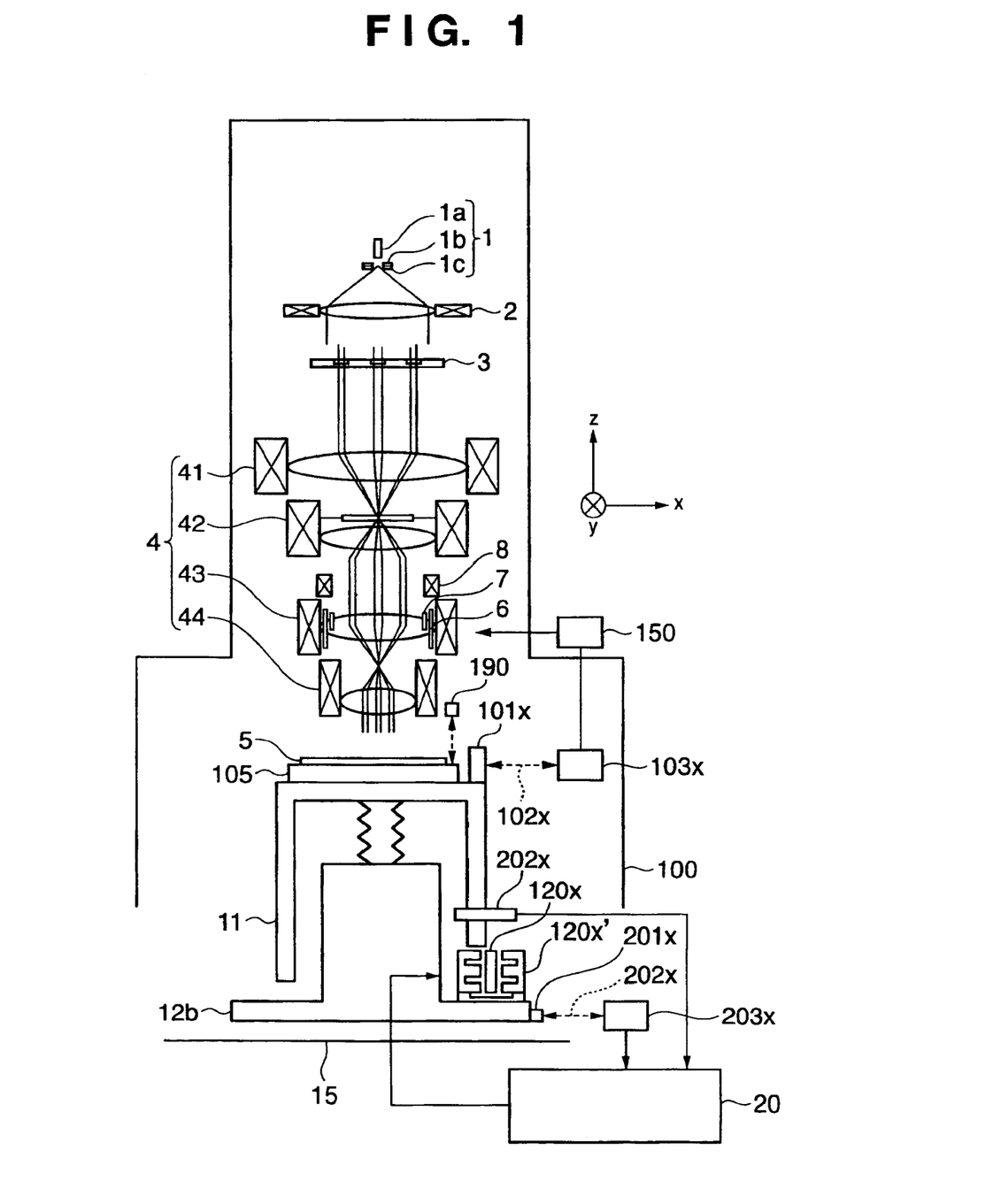
FIG. 1 is a schematic view showing the main part of an electron beam exposure apparatus according to the first embodiment of the present invention.

FIG. 1 is a schematic view showing the main part of an electron beam exposure apparatus according to a preferred embodiment of the present invention. Referring to FIG. 1, an electron gun 1 comprises a cathode 1a, a grid 1b, and an anode 1c. Electrons emitted from the cathode 1a form a crossover image between the grid 1b and anode 1c (this crossover image will be referred to as an electron source hereinafter).

Electrons emitted from the electron source form a substantially parallel electron beam through a condenser lens 2, whose front focal position is located at the electron source position. The substantially parallel electron beam comes incident on an element electron optical system array 3. The element electron optical system array 3 is formed by arranging a plurality of element electron optical systems, each comprising a blanking electrode, an aperture, and an electron lens, in a plane perpendicular to the Z-axis (an electron optical axis).

The element electron optical system array 3 forms a plurality of intermediate images of the electron source. The respective intermediate images are reduced and projected onto a wafer 5 by a reduction electron optical system 4, to form electron source images on the wafer 5. The respective element electron optical systems of the element electron optical system array 3 are set such that the spacing between adjacent electron source images on the wafer 5 is an integer multiple of the size of each electron source image. Additionally, the element electron optical system array 3 is arranged to differently adjust the position of each intermediate image in the direction of the electron optical axis, in accordance with the curvature of field of the reduction electron optical system 4, and to correct, in advance, an aberration that occurs when each intermediate image is reduced and projected onto the wafer 5 by the reduction electron optical system 4.

The reduction electron optical system 4 comprises a symmetric magnetic doublet including a first projection lens 41 and a second projection lens 42 and a symmetric magnetic doublet including a first projection lens 43 and a second projection lens 44. The distance between the two lenses 41 (43) and 42 (44) is f1+f2 where f1 is the focal length of the first projection lens 41 (43) and f2 is the focal length of the second projection lens 42 (44). The object point on the electron optical axis is at the focal position of the first projection lens 41 (43), and the image point on the electron optical axis is formed on the focal point of the second projection lens 42 (44). This image is reduced to −f2/f1 through these two lenses. The two lens magnetic fields are determined to act in the opposite directions. Hence, theoretically, Seidel aberrations other than five aberrations, i.e., spherical aberration, isotropic astigmatism, isotropic coma, curvature of field, and longitudinal chromatic aberration, and chromatic aberrations concerning rotation and magnification are cancelled.

A deflector 6 collectively deflects a plurality of electron beams from the element electron optical system array 3 to displace a plurality of electron source images on the wafer 5 by substantially the same displacement amount in the X- and Y-axis directions. The deflector 6 includes a main deflector which is used when a deflection width is large and a subdeflector which is used when the deflection width is small (both not shown). The main deflector is an electromagnetic defector, while the subdeflector is an electrostatic deflector.

A dynamic focus coil 7 corrects the focal position shift of an electron source image formed by the deflection aberration that occurs when the deflector 6 is actuated. A dynamic stigmatic coil 8 corrects deflection aberration caused by deflection, i.e., astigmatism, in the same manner as the dynamic focus coil 7.

A fine adjustment stage 11 serving as a substrate stage has a wafer 5 on it and is so arranged as to be movable by a predetermined amount in the direction of the electron optical axis (Z-axis), the rotation direction (θ) about the Z-axis, and the tilt directions (the rotation directions about the X- and Y-axes), and a direction of the plane perpendicular to the Z-axis (X-Y direction). That is, the fine adjustment stage 11 has six degrees of freedom.

Figure 5:
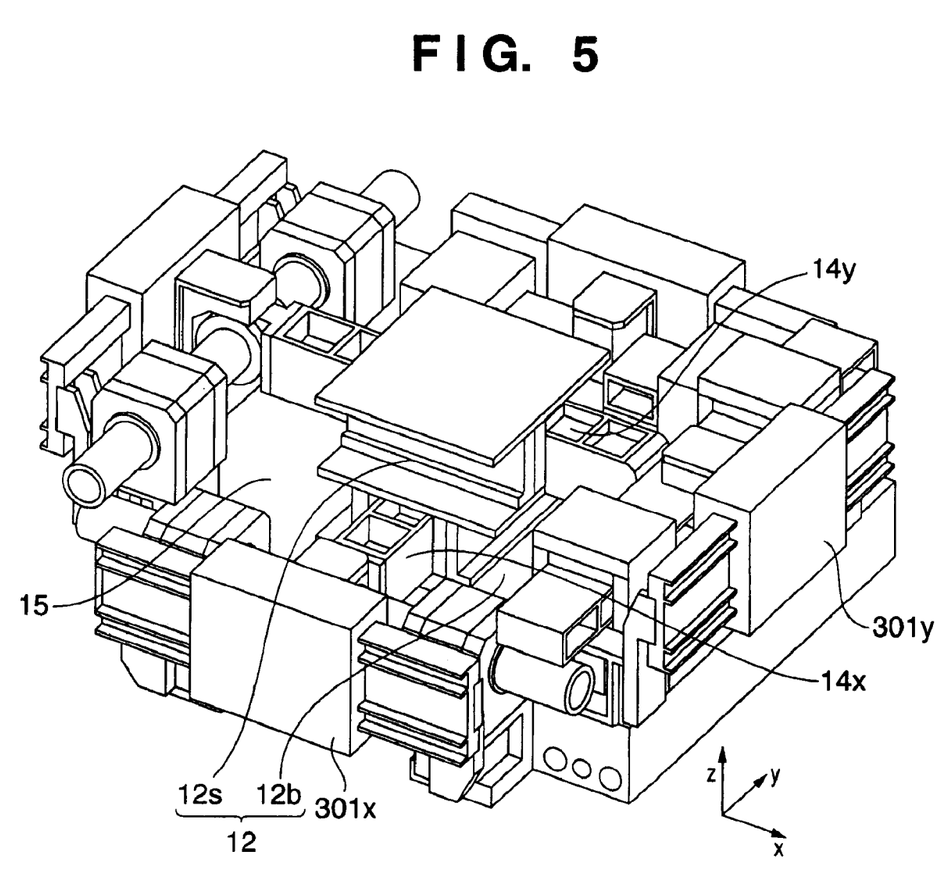
FIG. 5 is a view showing a preferred X-Y transfer stage.

A center slider 12 serving as an X-Y transfer stage (or coarse adjustment stage) has the fine adjustment stage 11 on it and is so arranged as to be movable in the X-Y direction perpendicular to the electron optical axis (Z-axis). An X-Y transfer stage as shown in FIG. 5 is preferably used as the center slider 12. The center slider 12 shown in FIG. 5 comprises a vacuum air guide and linear motor.

Referring to FIG. 5, the center slider 12 comprises a bottom plate 12b and a column member 12s. Below the bottom plate 12b, bearings are arranged on a stage base 15 to face each other. Inside the column member 12s, an X movable guide 14x and a Y movable guide 14y are sandwiched by similar bearings. The X movable guide 14x and Y movable guide 14y are arranged in the shape of a cross. The center slider 12 can move smoothly along the side surface of the Y movable guide 14y and the upper surface of the stage base 15 in the X direction by moving the X movable guide 14x in the X direction by an X-direction linear motor 301x. The center slider 12 can move smoothly along the side surface of the X movable guide 14x and the upper surface of the stage base 15 in the Y direction by moving the Y movable guide 14y in the Y direction by a Y-direction linear motor 301y.

Figure 2A:
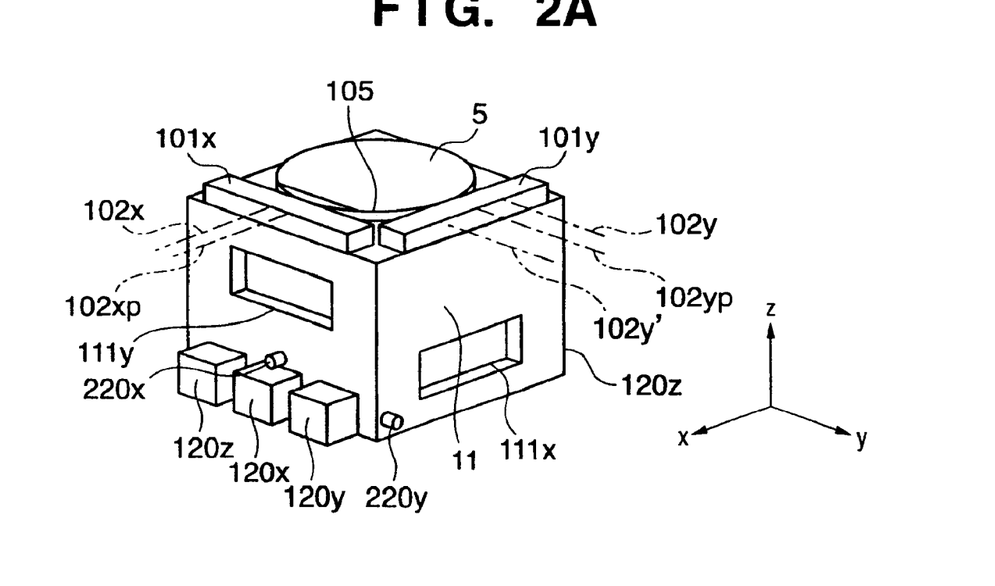
FIGS. 2A and 2B are schematic views of a preferred fine adjustment stage.
Figure 2B:
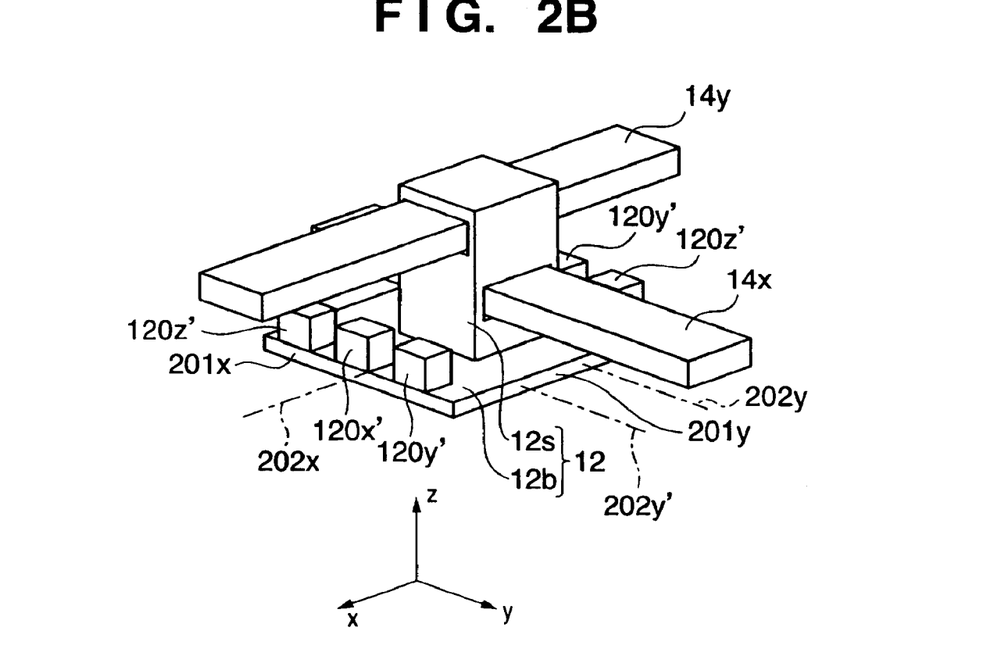
Figure 3:
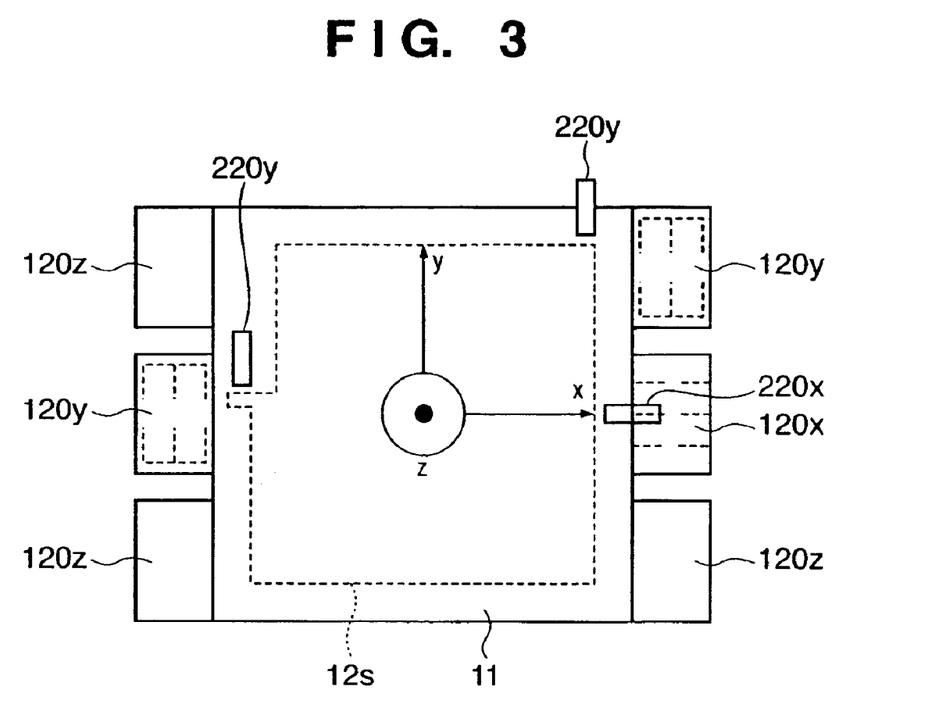
FIG. 3 is a schematic view of a preferred transfer stage.

The fine adjustment stage 11 will be described in detail with reference to FIGS. 1 to 3.

The fine adjustment stage 11 has a cage structure surrounding the center slider 12 and has apertures 111x and 111y, through which the X movable guide 14x and Y movable guide 14y extend in a non-contact manner.

Six electromagnet I cores 120 (120x, 120y, 120y, 120z, 120z, and 120z) are fixed at the distal end (lower end) of the fine adjustment stage 11. Electromagnet E cores 120' (120x', 120y', 120y', 120z', 120z', and 120z') are fixed on the bottom plate 12b to correspond to the electromagnet I cores 120, respectively. The fine adjustment stage 11 is driven with six degrees of freedom by six electromagnetic actuators each comprising the electromagnet I core 120 and electromagnet E core 120'. More specifically, the three sets of electromagnetic actuator components 120z and 120z' generate a driving force in the Z direction, the two sets of electromagnetic actuator components 120y and 120y' generate a driving force in the Y and θ directions, and the one set of electromagnetic actuator components 120x and 120x' generate a driving force in the X direction. An arrangement for driving the fine adjustment stage 11 with six degrees of freedom is not limited to this arrangement. Various arrangements may be adopted instead. A linear motor or the like may be adopted as an electromagnetic actuator in place of an electromagnet.

The adoption of a non-contact electromagnetic actuator as described above for use in driving the fine adjustment stage 11 prevents a driving reaction force from appearing upon driving of the fine adjustment stage 11, and contributes to solving a problem of dust generation.

The non-energized I cores 120 are attached to the fine adjustment stage 11, and the E cores 120' each including a coil are attached to the center slider 12. This arrangement has the advantage in that heat transfer to the fine adjustment stage 11 is remarkably reduced and that the fine adjustment stage 11 has no trailing wires. Such an electromagnetic actuator is excellent in that it generates a relatively large thrust, consumes relative little power, and generates no leakage magnetic field in a non-energized state.

The electromagnets 120 and 120' are coated with multiple electromagnetic shields of, e.g., permalloy to avoid any variation in magnetic field. In addition, the electromagnets 120 and 120' are spaced apart from the reduction electron optical system 4 by a sufficient distance to avoid being affected by the leakage magnetic field from the reduction electron optical system 4. More specifically, the electromagnets 120 and 120' are desirably located on the opposite sides of the barycenter of the center slider 12 (or the driving center in the Z direction) in the Z direction.

A substrate holder 105 for holding the wafer 5 and reflection mirrors 101x and 101y for position measurement are mounted on the upper surface of the fine adjustment stage 11. The reflection mirrors 101x and 101y are irradiated with laser light beams 102x and 102y from substrate surface laser interferometers 103 (103x, 103y, 103y', 103xp, and 103yp; only 103x is shown in FIG. 1 for illustrative convenience), thereby measuring the X and Y positions of the fine adjustment stage 11 with reference to, e.g., the inner wall of a chamber 100. The substrate surface laser interferometers 103 are fixed on, e.g., the sample chamber 100. The reflection mirrors 10x and 101y are also irradiated with laser light beams 102y', 102xp, and 102yp from the substrate surface laser interferometers 103 (103y', 103xp, and 103yp), thereby measuring rotation in the θ (rotation about the Z-axis) and tilt (rotation about the X- and Y-axes) directions. Measurement points (the irradiation positions of the laser light beams) are desirably located in the vicinity of the surface on which the wafer is mounted. The position, in the Z direction, of the fine adjustment stage 11 can be measured by an optical sensor 190 which uses non-photosensitive light.

Measurement values (of rotation in the θ direction (rotation about the Z-axis) and, as needed, rotation about X- and Y-axes) obtained by the substrate surface laser interferometers 103 are supplied to the deflector 6 for electron beams, and the tracks (irradiation positions) of electron beams are corrected in accordance with the position and posture of the wafer 5 on the basis of the supplied measurement values. If high-frequency vibrations occur in the fine adjustment stage 11, measurement values from the substrate surface laser interferometers 103 are preferably supplied to the deflector 6 through a band-limiting filter (e.g., a low-pass filter) 150 to prevent measurement values including vibration components from being supplied to the deflector 6. In addition to the correction by the deflector 6, at least one of rotation in the θ0 direction (rotation about the Z-axis), rotation about the X-axis, and rotation about the Y-axis of the fine adjustment stage 11 can be corrected by controlling the electromagnetic actuator components 120 and 120' on the basis of measurement results from the substrate surface laser interferometers 103. Moreover, if no high-frequency vibrations occur in the fine adjustment stage 11, measurement values may selectively bypass the filter.

Reflection mirrors 201x and 201y are arranged on the side surface of the bottom plate 12b of the center slider 12, and the X and Y positions of the center slider 12 (coarse adjustment stage) are measured by coarse adjustment system laser interferometers 203 (203x and 203y; only 203x is shown in FIG. 1 for illustrative convenience). Reference numerals 202x and 202y denote measurement axes (the optical paths of laser light beams) of the coarse adjustment system laser interferometers 203x and 203y, respectively. If the center slider 12 may greatly move about the Z-axis, a measurement axis 202y' (and a corresponding coarse adjustment system laser interferometer 203y') may be added for measurement in the θ direction. Measurement values obtained by the coarse adjustment system laser interferometers 203 are supplied to a fine adjustment stage controller 20.

Displacement sensors 220 (220x, 220y, and 220y'; only 202x is shown in FIG. 1 for illustrative convenience) are provided to measure a relative movement, in the X, Y, and θ directions, between the center slider 12 and the fine adjustment stage 11. Each displacement sensor 220 preferably comprises an electrostatic capacitance sensor, encoder, or the like. However, a sensor of any other type may be employed. The displacement sensors 220 are desirably arranged in the vicinity of the electromagnets 120x and 120y so as to correctly measure the gaps between the electromagnets 120 and 120' without any phase delay.

The controller 20 sends command values to the electromagnet E cores 120' each constituting an electromagnetic actuator for driving the fine adjustment stage 11 and sends command values to the linear motors 301x and 301y which drive the center slider 12, on the basis of measurement values obtained by the coarse adjustment system laser interferometers 203 and displacement sensors 220. With this operation, the fine adjustment stage 11 is controlled in the X and Y directions (and θ direction, as needed). The controller 20 determines a command value in, e.g., the following manner.

(1) The controller 20 determines command values to be sent to the linear motors 301x and 301y to drive the center slider 12, on the basis of measurement values from the coarse adjustment system laser interferometers 203.

(2) The controller 20 determines command values to be sent to the electromagnet E cores 120' each constituting an electromagnetic actuator for driving the fine adjustment stage 11, on the basis of measurement values (X- and Y-direction positions) from the coarse adjustment system laser interferometers 203 and measurement values (X- and Y-direction positions and, as needed, θ-direction position) from the displacement sensors 202 (e.g., on the basis of the sums of the measurement values).

(3) The controller 20 corrects the non-linearity of a control system (e.g., electromagnetic actuator components 120 and 120') on the basis of a measurement value from the displacement sensors 202.

To control the fine adjustment stage 11, various other methods are available. With the above-mentioned method, the fine adjustment stage 11 is so controlled as not to be affected by the coarse adjustment stage (center slider) 12 and as to compensate for the non-linearity of the control system (particularly, an electromagnetic actuator).

More specifically, in this embodiment, command values to be sent to the electromagnet E cores 120' each constituting an electromagnetic actuator for driving the fine adjustment stage 11 are determined on the basis of measurement values from the coarse adjustment system laser interferometers 203 and measurement values from the displacement sensors 202 (e.g., on the basis of the sums of the measurement values). Measurement values from the coarse adjustment system laser interferometers 203 and measurement values from the displacement sensors 202 are obtained using points in the vicinity of the electromagnetic actuator components 120 and 120' as measurement points. For this reason, the control gain of the control system can be set to a high value, and thus the fine adjustment stage 11 can stably and quickly be controlled. This makes it possible to draw a pattern on the wafer at high speed and high accuracy. Even if weak vibrations occur on the substrate surface (the surface on which the wafer 5 is arranged), the deflector 6 compensates for the positional shifts of respective electron beams caused by the vibrations on the basis of measurement values from the substrate surface laser interferometers 103. Therefore, a pattern can be drawn on the wafer at high accuracy.

As opposed to the above-mentioned method, assume that the electromagnetic actuator components 120 and 120' are controlled in accordance with measurement results from the substrate surface laser interferometers 103. In this case, a long distance between measurement points of the respective substrate surface laser interferometers 103 and the electromagnetic actuator components 120 and 120' induces vibrations having various natural frequencies in the control system. For this reason, the fine adjustment stage 11 cannot stably be controlled.

[Second Embodiment]

Figure 4:
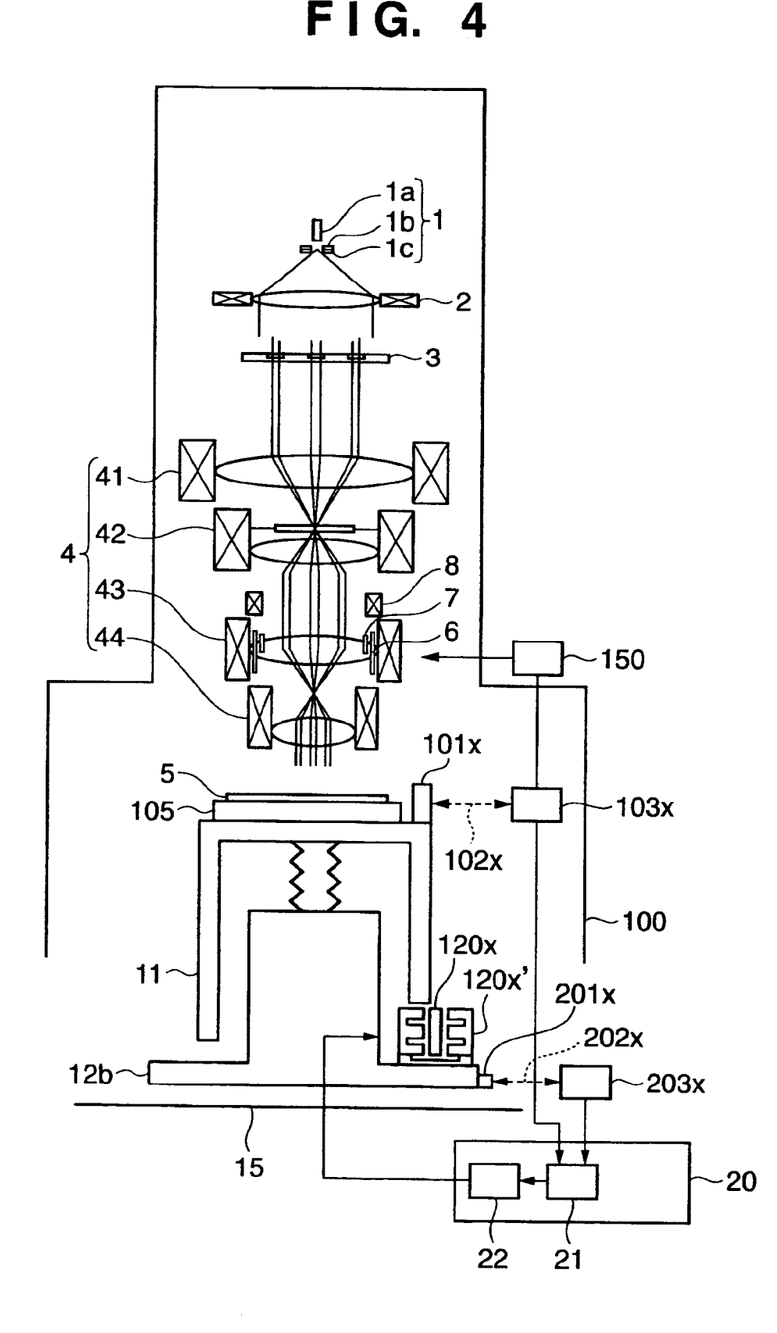
FIG. 4 is a schematic view showing the main part of an electron beam exposure apparatus according to the second embodiment of the present invention.

In this embodiment, displacement gauges 202 are omitted. Command values to be sent to electromagnet E cores 120' each constituting an electromagnetic actuator for driving a fine adjustment stage 11 are determined on the basis of measurement values obtained by coarse adjustment system laser interferometers 203 and measurement values obtained by substrate surface laser interferometers 103.

FIG. 4 is a schematic view showing the main part of an electron beam exposure apparatus according to the second embodiment of the present invention. Note that the same reference numerals as those in the first embodiment (FIG. 1) denote the same parts.

In this embodiment, a controller 20 receives measurement values (X- and Y-direction positions) obtained by the substrate surface laser interferometers 103 and measurement values (X- and Y-direction positions) obtained by the coarse adjustment system laser interferometers 203 and calculates by a computing device 21 differences between them (i.e., X- and Y-direction deviations from the measurement values from the substrate surface laser interferometers 103 and the measurement values from the coarse adjustment system laser interferometers 203). A filtering block 22 performs filtering for the calculation result so as to cancel the characteristics of a structure comprising electromagnetic actuator components 120 and 120', the fine adjustment stage 11, reflection mirrors 101, and the like. Command values to be sent to the electromagnet E cores 120' are corrected on the basis of the filtering result. With this operation, the gain of the control system of the fine adjustment stage 11 can be increased, and the fine adjustment stage 11 can stably be controlled at high speed.

The filtering block 22 of the controller 20 has, e.g., at least one band-limiting filter whose band to be limited is variable. By adjusting the band to be limited by the filter on the basis of simulation results or experimental results, the filtering block 22 of the controller 20 can stabilize the control of the fine adjustment stage 11.

If high-frequency vibrations occur in the fine adjustment stage 11, the positional relationship between the reflection mirrors 101 and the wafer (substrate) 5 cannot be guaranteed to be constant. Under the circumstances, measurement values from the substrate surface laser interferometers 103 are preferably supplied to a deflector 6 through a band-limiting filter (e.g., a low-pass filter) 150 in order to prevent measurement values including vibration components from being supplied to the deflector 6. Additionally, if no high-frequency vibrations occur in the fine adjustment stage 11, measurement values may selectively bypass the filter.

[Application Example]

Figure 8:
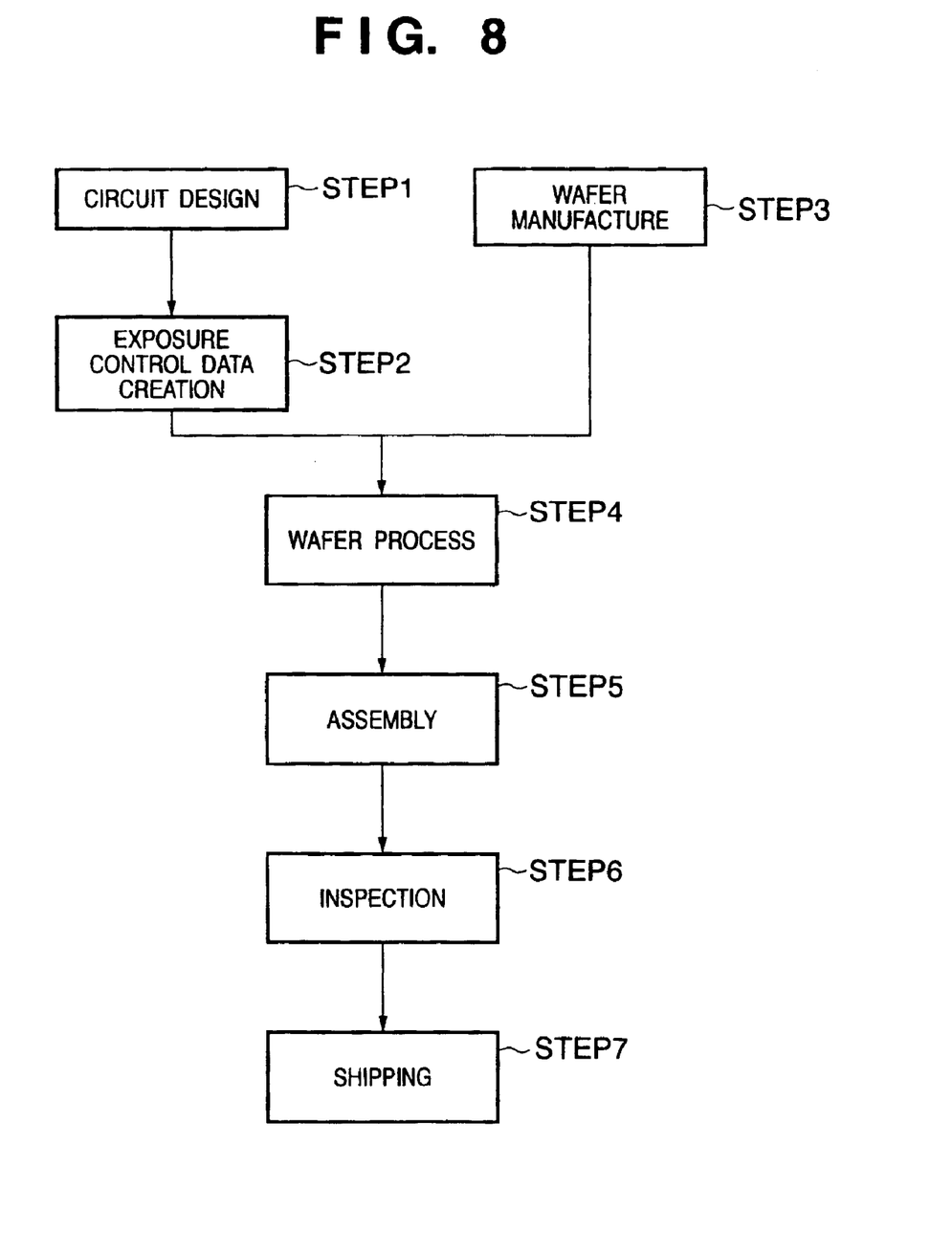
FIG. 8 is a flow chart showing the flow of the whole manufacturing process of a semiconductor device.

The manufacturing process of a semiconductor device using the above-mentioned electron beam exposure apparatuses will be described next. FIG. 8 shows the flow of the whole manufacturing process of the semiconductor device. In step 1 (circuit design), a semiconductor device circuit is designed. In step 2 (exposure control data creation), exposure control data for exposure control (e.g., the on/off control of electron beams) is created on the basis of the designed circuit pattern. In step 3 (wafer manufacture), a wafer is manufactured by using a material such as silicon. In step 4 (wafer process), called a preprocess, an actual circuit is formed on the wafer by lithography using the above-mentioned electron beam exposure apparatuses in the exposure step. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 9:
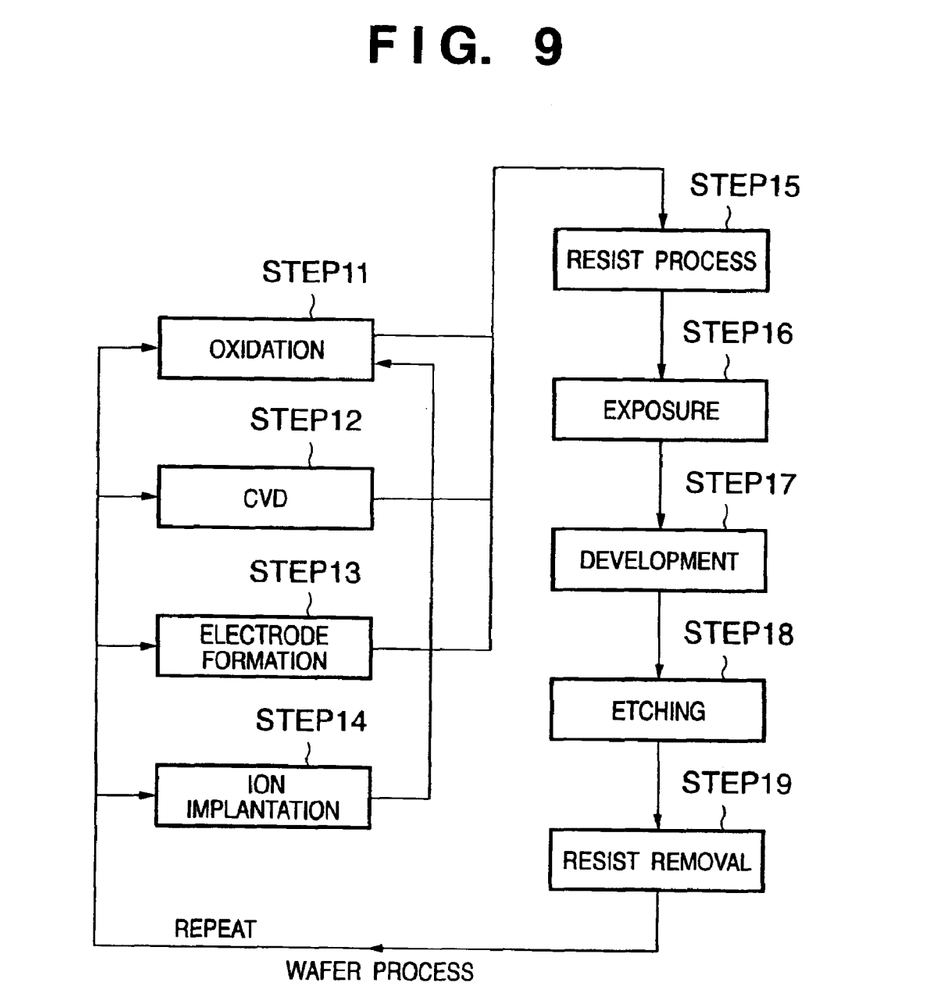
FIG. 9 is a flow chart showing the detailed flow of the wafer process of FIG. 8.

FIG. 9 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is drawn on the wafer using the above-mentioned electron beam exposure apparatuses. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

According to the present invention, for example, a pattern can be drawn on a substrate at high speed and high accuracy or a substrate stage can stably be controlled in addition to this.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus which draws a pattern on a substrate with electron beams, said apparatus comprising:

a substrate stage which supports the substrate;

a transfer stage which moves said substrate stage;

an electromagnetic actuator which moves said substrate stage relative to said transfer stage;

a first measurement system which measures a position of said transfer stage;

a second measurement system which measures a position of said substrate stage;

a controller which controls said electromagnetic actuator on the basis of measurement results obtained by said first and second measurement systems;

a deflector which deflects electron beams with which the substrate is irradiated; and a filter which performs filtering for a measurement result obtained by said second measurement system and supplies the filtered measurement result to said deflector.

2. The apparatus according to claim 1, wherein said second measurement system measures rotation of said substrate stage in addition to the position of said substrate stage, and said deflector adjusts deviations of electron beams on the basis of the position and rotation of said substrate stage obtained by said second measurement system.

3. The apparatus according to claim 1, wherein said second measurement system includes:

a first sensor which measures a position of said substrate stage with reference to a predetermined reference position; and a second sensor which measures a position of said substrate stage relative to said transfer stage, wherein said controller controls said electromagnetic actuator on the basis of measurement results obtained by said first measurement system and the second sensor, and said filter performs filtering for a measurement result obtained by said first sensor to supply the filtered measurement result to said deflector.

4. The apparatus according to claim 3, wherein said second sensor is arranged to measure a relative position of said substrate stage in the vicinity of said electromagnetic actuator.

5. The apparatus according to claim 1, wherein said substrate stage has a substrate holder on said substrate stage, said electromagnetic actuator and the substrate are arranged on opposite sides of a barycenter of said transfer stage in a Z-axis direction.

6. The apparatus according to claim 1, wherein said filter includes a band-limiting filter which blocks a predetermined band.

7. The apparatus according to claim 1, wherein said electromagnetic actuator includes an electromagnet as a driving source.

8. The apparatus according to claim 1, wherein said electromagnetic actuator includes a linear motor.

9. The apparatus according to claim 1, wherein said electromagnetic actuator is coated with an electromagnetic shield.

10. A device manufacturing method comprising:
a step of drawing a pattern on a substrate coated with a photosensitive agent using an exposure apparatus as defined in claim 1; and
a step of developing the substrate.

11. An exposure apparatus which draws a pattern on a substrate with electron beams, said apparatus comprising:
a substrate stage which supports the substrate;
a transfer stage which moves said substrate stage;
an electromagnetic actuator which moves said substrate stage relative to said transfer stage;
first measurement means for measuring a position of said substrate stage relative to a reference position;
second measurement means for measuring a position of said substrate stage relative to said transfer stage;
third measurement means for measuring a position of said transfer stage;
a controller which controls said electromagnetic actuator on the basis of measurement results obtained by said second measurement means and said third measurement means; and
a deflector which deflects electron beams with which the substrate is irradiated,
wherein said deflector is controlled on the basis of a measurement result obtained by said first measurement means.

* * * * *